(12) United States Patent
Kourkoulos et al.

(10) Patent No.: US 11,275,883 B2
(45) Date of Patent: Mar. 15, 2022

(54) MACHINE LEARNING-BASED CLASSIFICATION IN PARASITIC EXTRACTION AUTOMATION FOR CIRCUIT DESIGN AND VERIFICATION

(71) Applicant: Siemens Industry Software Inc., Plano, TX (US)

(72) Inventors: Vasileios Kourkoulos, Lake Oswego, OR (US); Lin Du, Wilsonville, OR (US); Renbo Chen, West Linn, OR (US)

(73) Assignee: Siemens Industry Software Inc., Plano, TX (US)

( * ) Notice: Subject to any disclaimer, the term of this patent is extended or adjusted under 35 U.S.C. 154(b) by 0 days.

(21) Appl. No.: 16/788,545

(22) Filed: Feb. 12, 2020

(65) Prior Publication Data

US 2021/0248299 A1 Aug. 12, 2021

(51) Int. Cl.
*G06F 30/398* (2020.01)
*G06N 20/00* (2019.01)
*G06F 30/392* (2020.01)

(52) U.S. Cl.
CPC .......... *G06F 30/398* (2020.01); *G06F 30/392* (2020.01); *G06N 20/00* (2019.01)

(58) Field of Classification Search
CPC .................................................... G06F 30/398
USPC ......................................................... 716/115
See application file for complete search history.

(56) References Cited

U.S. PATENT DOCUMENTS

| | | |
|---|---|---|
| 9,223,912 B1 | 12/2015 | Liapis et al. |
| 2005/0198605 A1 | 9/2005 | Knol et al. |
| 2006/0111884 A1 | 5/2006 | McGaughy et al. |
| 2009/0031268 A1 | 1/2009 | Miranda et al. |
| 2014/0019930 A1* | 1/2014 | Yuh .................. G06F 30/30 716/115 |
| 2014/0282308 A1 | 9/2014 | Chen et al. |
| 2015/0007124 A1 | 1/2015 | Krasnicki |
| 2015/0302128 A1 | 10/2015 | Katta et al. |

(Continued)

OTHER PUBLICATIONS

Pradipta, Geraldo et al, "A Machine Learning Based Parasitic Extraction Tool"; Oct. 31, 2019; Retrieved from the Internet: URL:https://github.com/The-OpenROAD-Projec t/PEX/raw/master/docs/A%20Machine%20Learning%20based%20Parasitic%20Extraction%20Tool.pdf, [retrieved on Jan. 27, 2021], pp. 1-3.

(Continued)

*Primary Examiner* — Eric D Lee

(57) ABSTRACT

This application discloses a computing system implementing a parasitic extraction tool to generate a parasitic model from physical design layout of an integrated circuit. The computing system also can implement a machine-learning classifier that, when trained with a training data set, can classify the physical design layout based on physical or electrical characteristics associated with the physical design layout, and can utilize the classification to select a set of scaling coefficients. The computing system can apply the selected set of the scaling coefficients to adjust coupling capacitances in the parasitic model and generate a parasitic netlist for the physical design layout. The computing system can generate the training data set by determining sets of the scaling coefficients from the test physical design layouts and labeling the test physical design layouts with the sets of the scaling coefficients.

20 Claims, 10 Drawing Sheets

(56) References Cited

U.S. PATENT DOCUMENTS

2018/0231604 A1* 8/2018 Kim .................. G01R 31/2851
2019/0121928 A1* 4/2019 Wu ......................... G06N 3/08

OTHER PUBLICATIONS

Zhixing, Li, "Machine Learning Applied in 2D Parasitic Extraction"; Master Thesis; Dec. 2014, Retrieved from the Internet: URL:https://oaktrust.library.tamu.edu/bitstream/handle/1969.1/154203/LI-THESIS-2014.pdf?sequence=l&isAllowed=y, pp. 1-68.

* cited by examiner

MACHINE LEARNING-BASED CLASSIFICATION IN PARASITIC EXTRACTION AUTOMATION FOR CIRCUIT DESIGN AND VERIFICATION

RELATED APPLICATION

This patent application claims is related to U.S. patent application Ser. No. 16/549,929, filed Aug. 23, 2019, which is incorporated by reference herein.

TECHNICAL FIELD

This application is generally related to electronic design automation and, more specifically, to machine learning-based classification in parasitic extraction automation for circuit design and verification.

BACKGROUND

In a design flow for fabricating integrated circuits, a physical design of an integrated circuit can describe specific geometric elements, often referred to as a "layout" design. The geometric elements, which typically are polygons, define the shapes that will be created in various materials to manufacture the integrated circuit. Typically, a designer will select groups of geometric elements representing circuit device components, e.g., contacts, gates, etc., and place them in a design area. These groups of geometric elements may be custom designed, selected from a library of previously-created designs, or some combination of both. Once the groups of geometric elements representing circuit device components have been placed, geometric elements representing connection lines then are then placed between these geometric elements according to the predetermined route. These lines will form the wiring used to interconnect the electronic devices.

Typically, a designer will perform a number of analyses on the resulting layout design of the integrated circuit. For example, the layout design may be analyzed to confirm that it accurately represents the circuit devices and their relationships as described in a logical design of the integrated circuit. The layout design also may be analyzed to confirm that it complies with various design requirements, such as minimum spacing between the geometric elements. Still further, the layout design may be modified to include the use of redundant geometric elements or the addition of corrective features to various geometric elements, to counteract limitations in the manufacturing process, etc. For example, the design flow process may include one or more resolution enhancement technique (RET) processes, that modify the layout design data to improve the usable resolution of the reticle or mask created from the design in a photolithographic manufacturing process.

During the physical design analysis, the layout design may be analyzed to determine parasitic values, such as resistances, capacitances, inductances, or the like, of nets in the layout design, which can be utilized to determine whether the layout design includes voltage drops, signal delay, or signal noise. Most circuit designers utilize a parasitic extraction tool to extract these parasitic values from the layout design, for example, extracting nets from the layout design, determining parasitic electrical models from the extracted nets, and writing the parasitic electrical models to a netlist. For typical layout designs, most of the parasitic electrical models include an electrical representation of one extracted net, as each net is typically intended to be electrically-independent from other nets in the layout design. However, since most layout designs include nets that experience an unintended exchange of electromagnetic fields—often called noise or cross-talk—some of the parasitic electrical models include electrical representations of multiple different nets coupled with a capacitance representing the noise or cross-talk between the nets.

Foundries that manufacture integrated circuits can generate rules, often called a rule deck, to guide operation of the parasitic extraction tools. These foundries can work with the manufacturers of the parasitic extraction tools to generate the rules and certify the parasitic extraction tools operate within a margin of error set by the foundry. For example, foundries can provide manufacturers of parasitic extraction tools with test specifications of various layout geometries along with reference parasitic models for the test specifications. The manufacturers of parasitic extraction tools can generate layout models based on the test specifications, perform parasitic extraction on the layout models, and then compare the resultant parasitic models to the reference parasitic models from the foundry. When the differences between the resultant parasitic models and the reference parasitic models fall within the margin of error, the foundry can certify the parasitic extraction tool. The foundries often provide several thousand different test specifications, rendering it a difficult, often iterative, and time-consuming task for the manufacturers of parasitic extraction tools to generate layout models and properly configure the parasitic extraction tool to meet the tight error requirements for foundry certification.

SUMMARY

This application discloses a computing system implementing a parasitic extraction tool to generate a parasitic model from physical design layout of an integrated circuit with automated capacitance scaling. The computing system can implement a machine-learning classifier that, when trained with a training data set, can classify the physical design layout based on physical properties of the physical design layout, such as a structural density of at least a portion of the physical design layout, or electrical properties of the physical design layout, such as a percentage of floating nets as opposed to a total number of nets. The computing system can utilize the classification to select a set of scaling coefficients. The computing system can apply the selected set of the scaling coefficients to adjust coupling capacitances in the parasitic model and generate a parasitic netlist for the physical design layout.

The computing system can generate the training data set and identify sets of the scaling coefficients by generating parasitic models for the test physical design layouts using different setting configurations for a parasitic extraction tool, selecting, for each of the test physical design layouts, a setting configuration of the parasitic extraction tool based, at least in part, on a comparison of the generated parasitic models with reference netlists associated with the test physical design layouts. The computing system can utilize the selected setting configurations to cluster the parasitic models into groups based on the selected settings of the parasitic extraction tool, and determine a set of the scaling coefficients for each of the groups of the parasitic models based on geometric information in the test physical design layouts. The computing system can assign the sets of the scaling coefficients to the test physical design layouts as labels and then utilized the labeled test physical design layouts as the training data set for the machine-learning classifier. Embodiments will be described below in greater detail.

DETAILED DESCRIPTION

Figure 1:
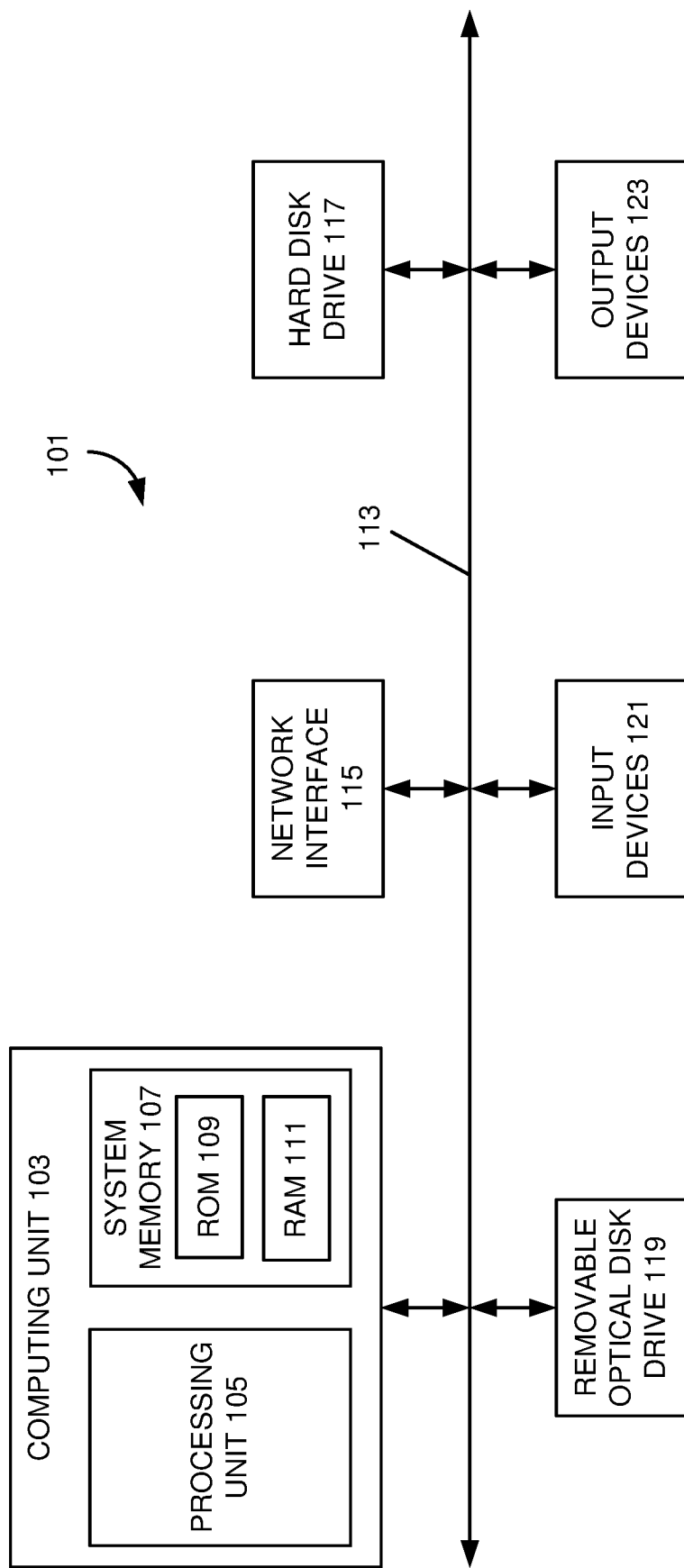
FIGS. 1 and 2 illustrate an example of a computer system of the type that may be used to implement various embodiments.

Various examples may be implemented through the execution of software instructions by a computing device 101, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices 115-123. For example, the processing unit 105 or the system memory 107 may be directly or indirectly connected to one or more additional memory storage devices, such as a hard disk drive 117, which can be magnetic and/or removable, a removable optical disk drive 119, and/or a flash memory card. The processing unit 105 and the system memory 107 also may be directly or indirectly connected to one or more input devices 121 and one or more output devices 123. The input devices 121 may include, for example, a keyboard, a pointing device (such as a mouse, touchpad, stylus, trackball, or joystick), a scanner, a camera, and a microphone. The output devices 123 may include, for example, a monitor display, a printer and speakers. With various examples of the computing device 101, one or more of the peripheral devices 115-123 may be internally housed with the computing unit 103. Alternately, one or more of the peripheral devices 115-123 may be external to the housing for the computing unit 103 and connected to the bus 113 through, for example, a Universal Serial Bus (USB) connection.

With some implementations, the computing unit 103 may be directly or indirectly connected to a network interface 115 for communicating with other devices making up a network. The network interface 115 can translate data and control signals from the computing unit 103 into network messages according to one or more communication protocols, such as the transmission control protocol (TCP) and the Internet protocol (IP). Also, the network interface 115 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computing device 101 is illustrated as an example only, and it not intended to be limiting. Various embodiments may be implemented using one or more computing devices that include the components of the computing device 101 illustrated in FIG. 1, which include only a subset of the components illustrated in FIG. 1, or which include an alternate combination of components, including components that are not shown in FIG. 1. For example, various embodiments may be implemented using a multi-processor computer, a plurality of single and/or multiprocessor computers arranged into a network, or some combination of both.

Figure 2:
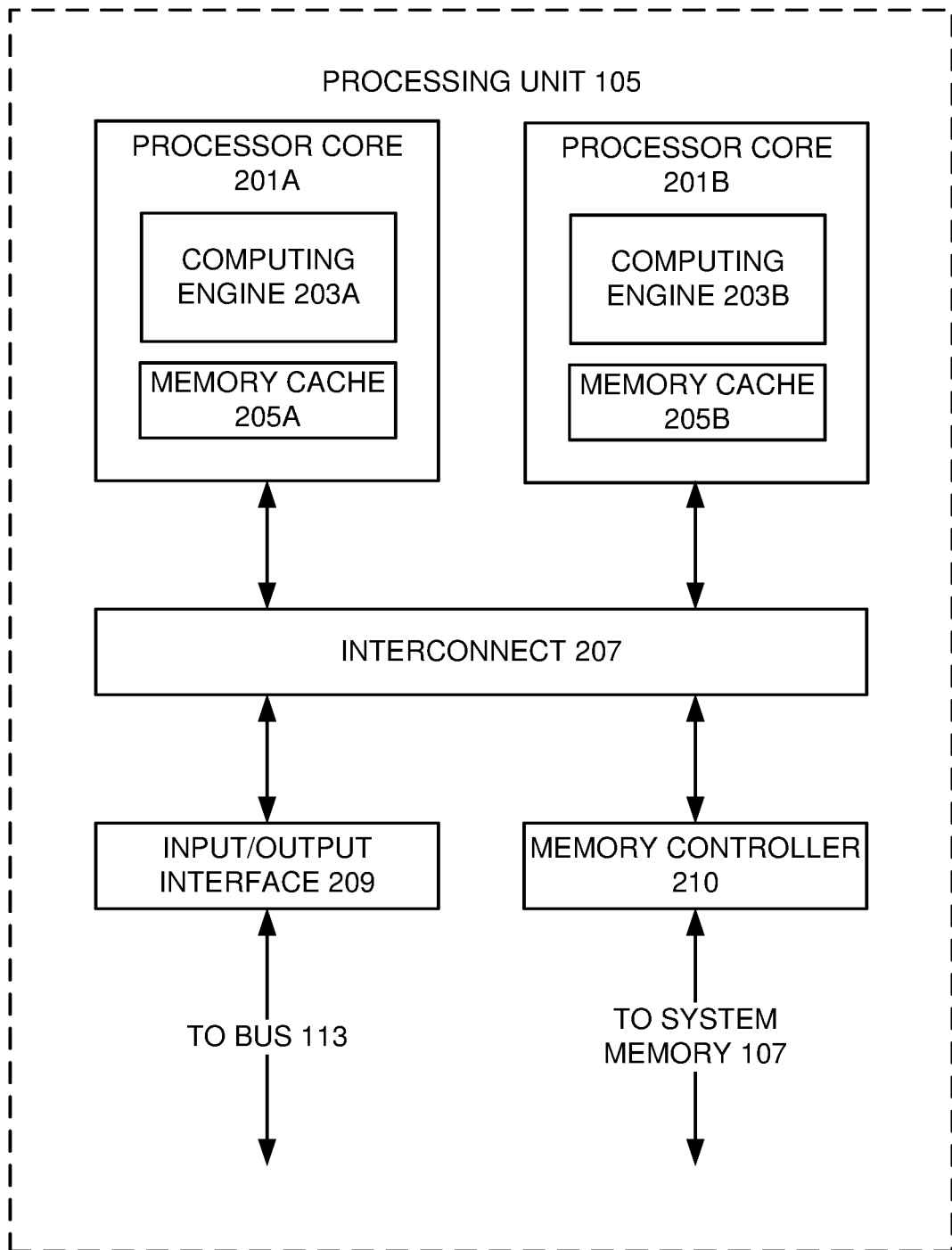

With some implementations, the processor unit 105 can have more than one processor core. Accordingly, FIG. 2 illustrates an example of a multi-core processor unit 105 that may be employed with various embodiments. As seen in this figure, the processor unit 105 includes a plurality of processor cores 201A and 201B. Each processor core 201A and 201B includes a computing engine 203A and 203B, respectively, and a memory cache 205A and 205B, respectively. As known to those of ordinary skill in the art, a computing engine 203A and 203B can include logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203A and 203B may then use its corresponding memory cache 205A and 205B, respectively, to quickly store and retrieve data and/or instructions for execution.

Each processor core 201A and 201B is connected to an interconnect 207. The particular construction of the interconnect 207 may vary depending upon the architecture of the processor unit 105. With some processor cores 201A and 201B, such as the Cell microprocessor created by Sony Corporation, Toshiba Corporation and IBM Corporation, the interconnect 207 may be implemented as an interconnect bus. With other processor units 201A and 201B, however, such as the Opteron™ and Athlon™ dual-core processors available from Advanced Micro Devices of Sunnyvale, Calif., the interconnect 207 may be implemented as a system request interface device. In any case, the processor cores 201A and 201B communicate through the interconnect 207 with an input/output interface 209 and a memory controller 210. The input/output interface 209 provides a communication interface to the bus 113. Similarly, the memory controller 210 controls the exchange of information to the system memory 107. With some implementations, the processor unit 105 may include additional components, such as a high-level cache memory accessible shared by the processor cores 201A and 201B. It also should be appreciated that the description of the computer network illustrated in FIG. 1 and FIG. 2 is provided as an example only, and it not intended to suggest any limitation as to the scope of use or functionality of alternate embodiments.

Machine Learning-Based Parasitic Extraction Automation

Figure 3:
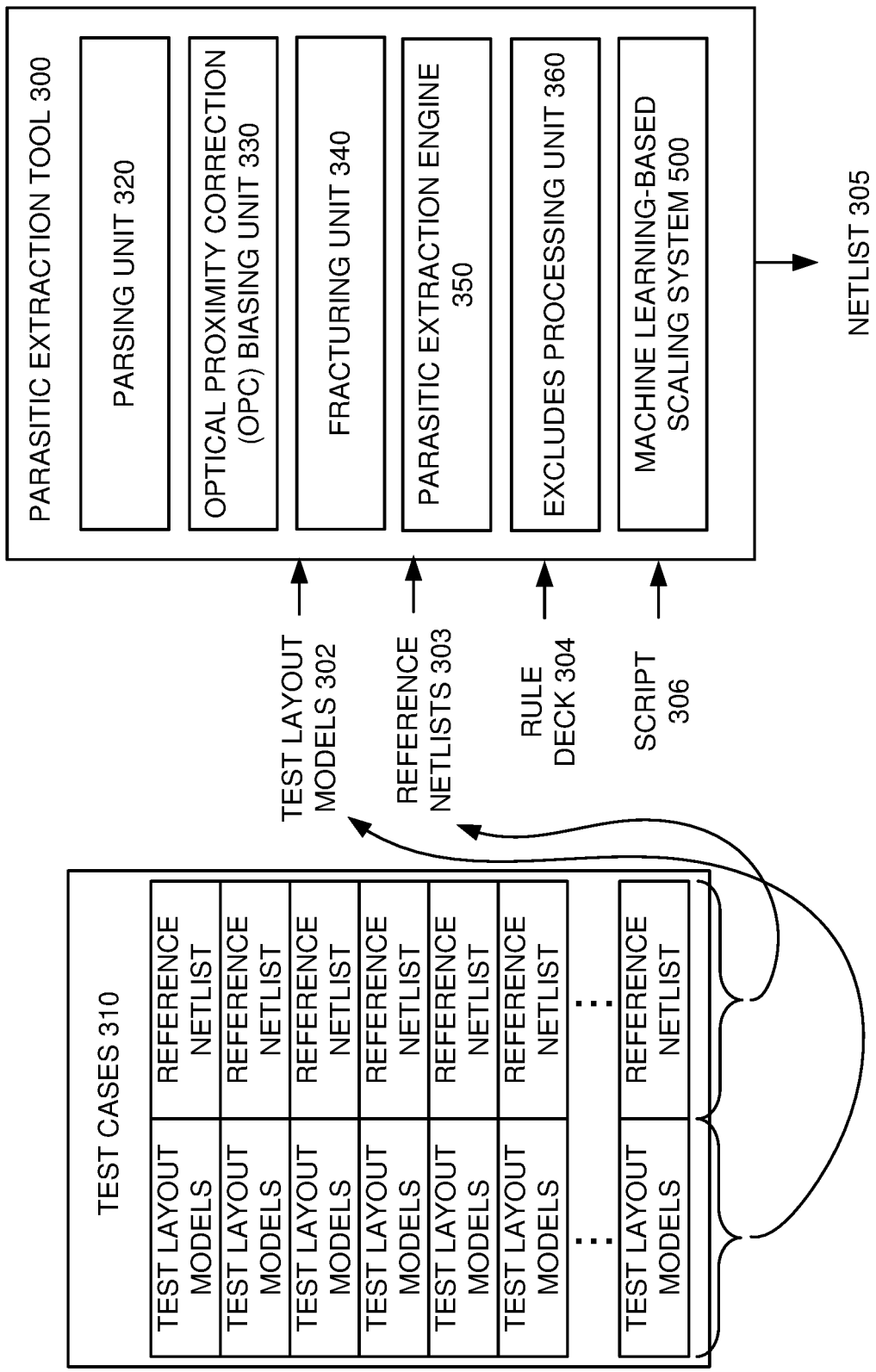
FIG. 3 illustrates an example of a parasitic extraction tool implementing automated capacitance scaling according to various embodiments.

FIG. 3 illustrates an example of a parasitic extraction tool 300 implementing automated capacitance scaling according to various embodiments. Referring to FIG. 3, the parasitic extraction tool 300 can receive a physical design layout, for example, to describe an electronic device in terms of planar geometric shapes corresponding to patterns of metal, oxide, or semiconductor layers that make up components of the electronic device. In some embodiments, the physical design layout can describe or model the electronic device in a Library Exchange Format (LEF), a Design Exchange Format (DEF), or the like.

The parasitic extraction tool 300 can receive a rule deck 304 developed by a foundry that describes design rules for geometric configurations of physical integrated circuit design data. The parasitic extraction tool 300 can utilize the design rules in the rule deck 304 to perform parasitic extraction on the physical design layout, for example, by converting the physical design layout into an electrical representation, such as a group of electrically-independent parasitic models, and generate a netlist 305 including the electrical representation of the physical design layout. In some embodiments, the netlist 305 can describe or model the electronic device in a Standard Parasitic Exchange Format (SPEF), or the like.

The parasitic extraction tool 300 can include a parsing unit 320 to parse the physical design layout based, at least in part, on the design rules in the rule deck 304. The parasitic extraction tool 300 can include an optical proximity correction (OPC) biasing unit 330 to alter the structure of the physical design layout, for example, edges in the physical layout design may be adjusted to make certain portions of the geometric elements larger or smaller, in accordance with how much additional light exposure (or lack of exposure) may be desired at certain points on the substrate.

The parasitic extraction tool 300 can include a fracturing unit 340 to select portions of the physical layout design to represent with electrical parasitic elements based, at least in part, on the rule deck 304. For example, a conductive trace represented in the physical layout design can be fractured into multiple portions, each to be represented by a different resistive element and at least one conductive element. The fracturing unit 340 can determine how to divide the physical layout design for the parasitic extraction process.

The parasitic extraction tool 300 can include a parasitic extraction engine 350 to extract nets from the physical design layout and identify parasitic values in each extract net based on how the net was divided by the fracturing unit 340. The parasitic extraction engine 350 can generate an electrical representation of each extracted net based on the parasitic values. The parasitic values can include resistances in the nets, capacitances between the net and a ground plane having a corresponding ground voltage, coupling capacitances between proximate nets, inductances, or the like. In some embodiments, the coupling capacitance in the electrical representation can model noise or cross-talk in the net due to exchange of electromagnetic fields between multiple nets.

The parasitic extraction tool 300 can include an excludes processing unit 360 to identify portions of the physical layout design to exclude from the parasitic extraction process. For example, a foundry may manufacture an electrical component, such as a transistor, without providing detail on its physical layout design, so the excludes processing unit 360 remove the internal structure of the electrical component from the parasitic extraction process performed by the parasitic extraction engine 350. An example of parasitic extraction will be described below with reference to FIG. 4.

Figure 4:
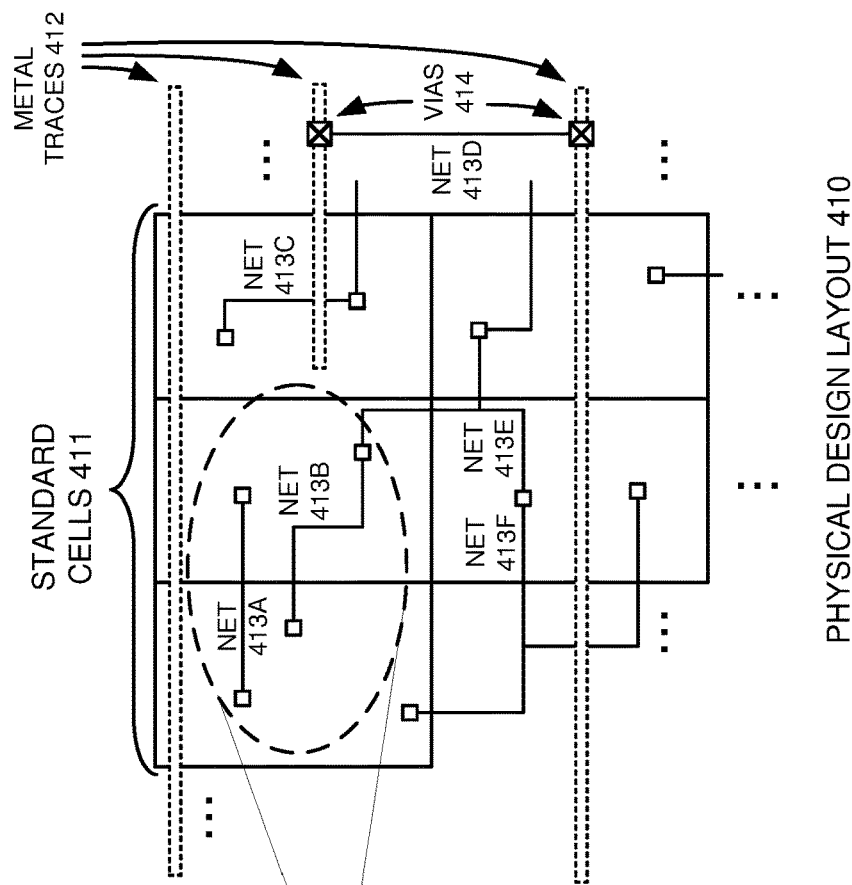
FIG. 4 illustrates an example implementation of parasitic extraction according to various embodiments.
Figure 4:
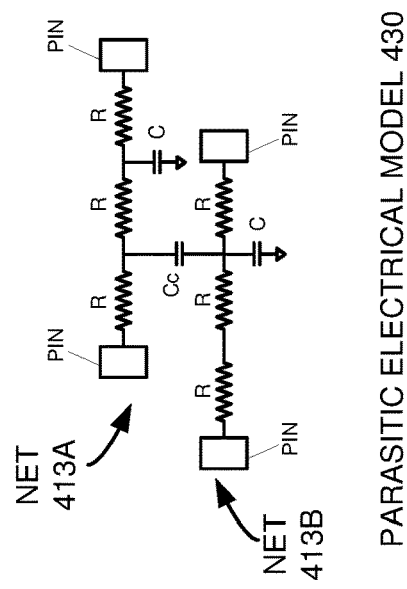

FIG. 4 illustrates an example implementation of parasitic extraction according to various embodiments of the invention. Referring to FIG. 4, a physical design layout 410 can describe an electronic device in terms of planar geometric shapes corresponding to patterns of metal, oxide, or semiconductor layers that make up components of the electronic device. In some embodiments, the physical design layout 410 can describe or model the electronic device in a Library Exchange Format (LEF), a Design Exchange Format (DEF), or the like.

The physical design layout 410 can include an array of standard cells 411, each including circuitry, such as a group of one or more transistors and interconnect structures to provide, for example, Boolean logic, storage, or the like, and at least one pins coupled to the circuitry. The physical design layout 410 can include nets 413A-413F to describe wires or electrical paths between pins in the physical design layout 410, for example, to interconnect circuitry in the standard cells 411. The physical design layout 410 also can include additional metal layers, such as metal traces 412, and vias 414 to interconnect different layers of the physical design layout 410.

During parasitic extraction, a parasitic extraction tool can extract nets from the physical design layout 410 and convert the nets 413 into one or more corresponding electrical representations. For simplicity, FIG. 4 shows the parasitic extraction of nets 413A and 413B and their conversion into a parasitic electrical model 430. The parasitic electrical model 430 can include an electrical representation of net 413A coupled to an electrical representation of net 413B with coupling capacitors Cc.

Referring back to FIG. 3, the parasitic extraction tool 300 can be tested, for example, with test cases 310. For example, a foundry typically has a certification process for electronic design tools, such the parasitic extraction tool 300, to ensure compatibility between the operation of electronic design tools and integrated circuit manufacturing performed by the foundry. For parasitic extraction, the foundry can generate a foundry certification test, for example, having test cases 310, that, when passed by the parasitic extraction tool 300, can allow the foundry to certify the parasitic extraction tool 300 complies with the manufacturing process of the foundry. In other examples, the parasitic extraction tool 300 can be tested with test cases 310 to gauge the accuracy of the parasitic extraction tool 300, such as with a higher accuracy test, or for the determination of accuracy of parasitic extraction for a specific structure, such as in a trapezoidal accuracy test.

The test cases 310 can each include a test layout model 302 and optionally a corresponding reference netlist 303. Each of the test layout models 302 can include a layout design of physical structures for fabrication and potentially a written description of the physical structures to undergo parasitic extraction. The reference netlists 302 can include netlists describing parasitic electrical models associated with their corresponding test layout model 302. In some embodiments, the reference netlists 303 can describe or model an electronic device in a Standard Parasitic Exchange Format (SPEF), or the like. In some embodiments, the test cases 310 can include a reference number corresponding to a characteristic of a netlist generated from a test layout model 302 that has been simulated. For example, the characteristic can be a ring oscillation frequency simulated from an extracted netlist of a ring oscillator, a delay simulated from an extracted netlist of a static random access memory (SRAM) cell or a standard cell, or the like.

In some example embodiments, in order to pass the test cases 310, the manufacturer of the parasitic extraction tool generates physical structure descriptions from the layout designs in test layout models 302 and written descriptions of the physical structures in test layout models 302, performs parasitic extraction on the physical structure descriptions to generate the netlists 305, and applies a script 306 to the generated netlists 305 to determine whether the parasitic extraction tool 300 passes the test cases 310. The script 306 can prompt the parasitic extraction tool 300, in some embodiments, to compare the netlists 305 to the reference netlists 303. When the differences between the netlists 305 and the reference netlists 303 or the simulation results and the reference number fall below a preset threshold of allowable error for each of the test cases, the parasitic extraction tool 300 can be deemed to have passed one or more of the test cases 310. In some embodiments, the script 306 can prompt the parasitic extraction tool 300 to simulate the netlists 305 and then compare the simulated results to the reference number. When the differences between the netlists 305 and the reference number fall below a preset threshold of allowable error for each of the test cases, the parasitic extraction tool 300 can be deemed to have passed one or more of the test cases 310.

The parasitic extraction tool 300 can receive the test layout models 302 describing layout designs in terms of planar geometric shapes corresponding to patterns of metal, oxide, or semiconductor layers that make up components of the electronic device. In some embodiments, the layout design in the test layout models 302 can describe or model an electronic device in a Library Exchange Format (LEF), a Design Exchange Format (DEF), or the like.

The parasitic extraction tool 300 can receive reference netlists 303, for example, from the test cases 310. Each of the reference netlists 303 can correspond to one or more electrical parasitic models for the corresponding test layout models 302. In some embodiments, the reference netlists 303 can describe or model the electronic device in a Standard Parasitic Exchange Format (SPEF), or the like.

The parasitic extraction tool 300 can convert the layout design in the test layout models 302 into physical structures based on the written description of the physical structures in the test layout models 302, perform parasitic extraction on the physical structures based, at least in part, on the rule deck 304 to generate the netlists 305.

The parasitic extraction tool 300 can include a machine learning-based scaling system 500 to determine differences or errors between the netlists 305 and the reference netlists 303 for each of the test cases. The machine learning-based scaling system 500 can reduce the differences or errors by scaling the capacitances in the netlists 305 generated from the physical design structures with scaling coefficients. In some embodiments, the machine learning-based scaling system 500 can identify different classes of physical design structures and different sets of scaling coefficients to utilize for each of the classes. The machine learning-based scaling system 500 can include a machine learning classifier that can be trained to classify physical design structures into one of the identified classes and thus associated the physical design structures with a particular set of scaling coefficients to be used during the parasitic extraction process. By using a classification-based approach to selecting and applying scaling coefficients, the machine learning-based scaling system 500 can generate netlists 305 having differences with the reference netlists 303 or having simulated results with differences to the reference numbers that fall below a threshold level of allowable error. Embodiments of the machine learning-based scaling of parasitic capacitances will be described below in greater detail.

Figure 5:
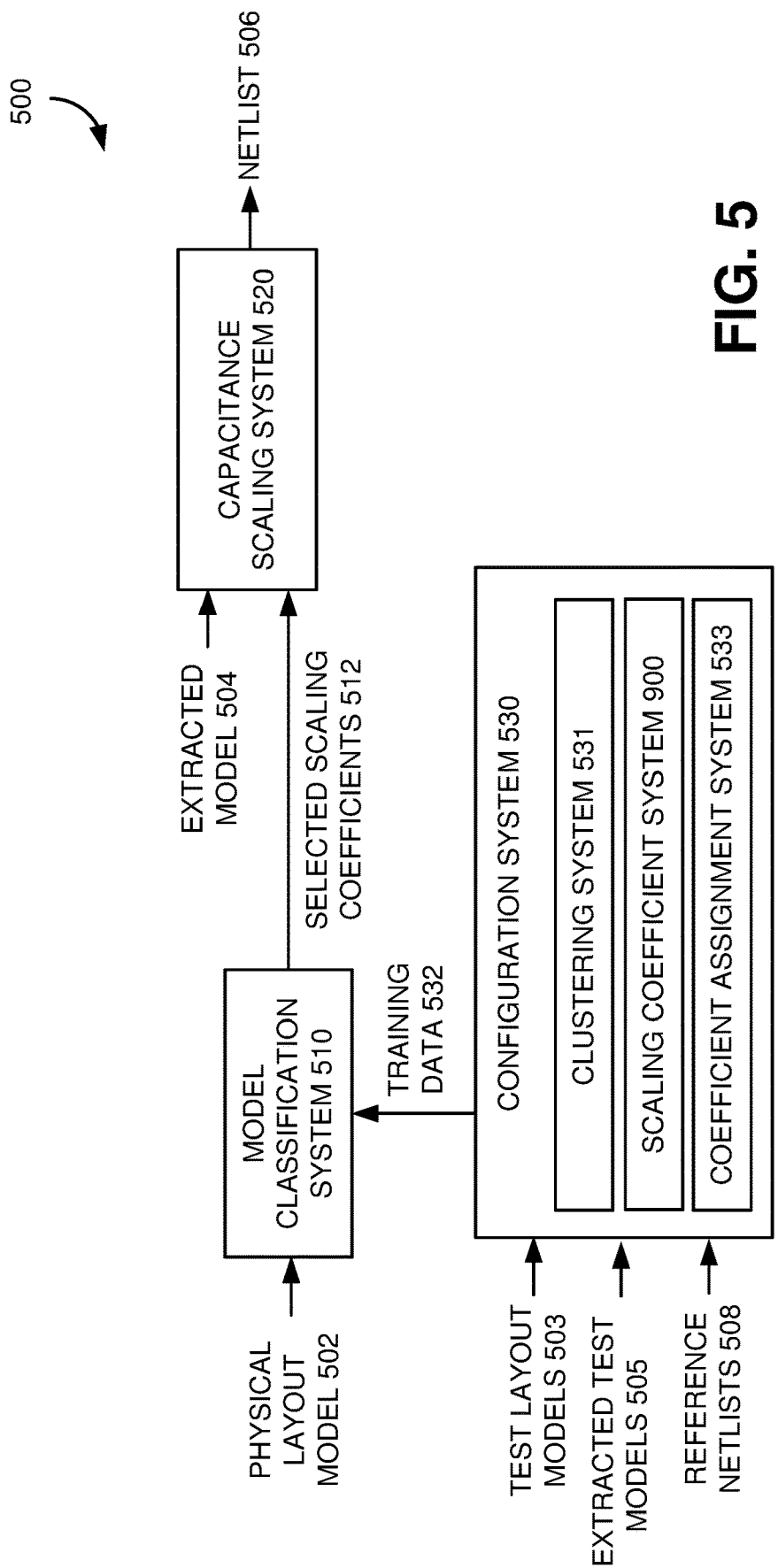
FIG. 5 illustrates an example machine learning-based scaling system implemented in a parasitic extraction tool according to various examples.
Figure 6:
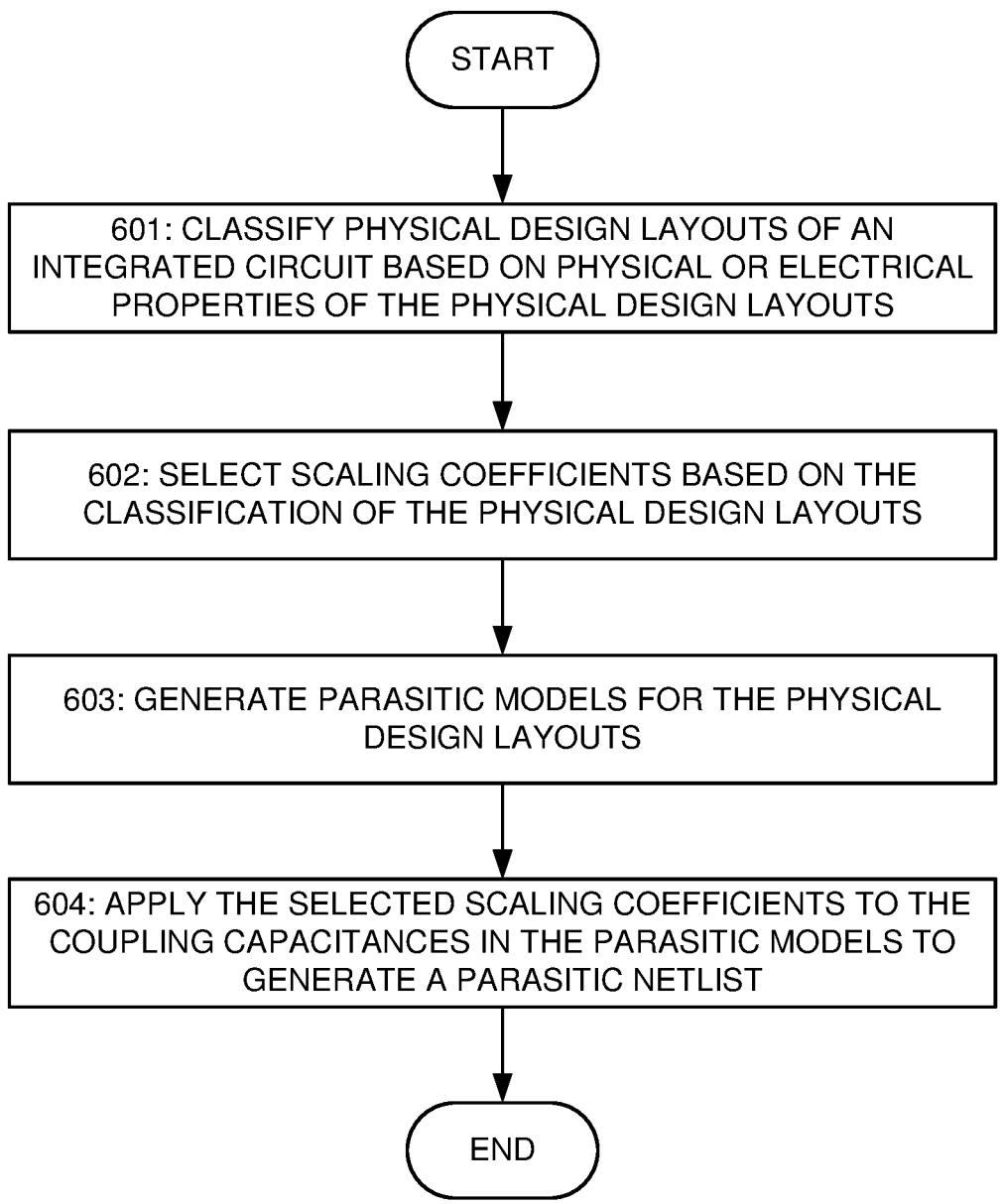
FIG. 6 illustrates a flowchart showing example classification-based capacitance scaling in a parasitic extraction tool according to various examples.

FIG. 5 illustrates an example machine learning-based scaling system 500 implemented in a parasitic extraction tool according to various examples. FIG. 6 illustrates a flowchart showing example classification-based capacitance scaling in a parasitic extraction tool according to various examples. Referring to FIGS. 5 and 6, the machine learning-based scaling system 500 can include a model classification system 510 to receive a physical design layout model 502 that, for example, can describe an electronic device in terms of planar geometric shapes corresponding to patterns of metal, oxide, or semiconductor layers that make up components of the electronic device. In some embodiments, the physical design layout 502 can describe or model the electronic device in a Library Exchange Format (LEF), a Design Exchange Format (DEF), or the like.

The model classification system 510 can store multiple sets of scaling coefficients, which can be correlated to different types of physical design layouts. The model classification system 510 can classify the physical design layout 502 as corresponding to the at least one of the types of physical design layouts. In some embodiments, such as in a block 601 of FIG. 6, the parasitic extraction tool can classify physical design layouts of an integrated circuit based on physical characteristics, such as structural densities of the physical design layouts, or electrical characteristics. The parasitic extraction tool, in some embodiments, can generate feature vectors based on the physical design layouts, which can describe the features and physical characteristics of the physical design layouts, and provide the feature vectors to the model classification system 510 for classification of the corresponding physical design layouts. In some embodiments, the model classification system 510 can classify the physical design layout 502 as corresponding to the at least one of the types of physical design layouts based on characteristics of the feature vectors, such as a structural density, or the like. The model classification system 510, for example, in a block 602 of FIG. 6, can select at least one set of the scaling coefficients based on the classification of the physical design layout 502, and output the selected scaling coefficients 512 for use in generating a netlist 506.

In some embodiments, the model classification system 510 can perform the classification utilizing a machine learning classifier, for example, implemented with a neural network or the like, which has been trained with training data 532. The training data 532 can include different types of physical design layouts labeled with a corresponding set of scaling coefficients. In some embodiments, the machine learning classifier can utilize the training data 532 to associate structure density in a physical design layout or portions thereof to a set of scaling coefficients. Embodiments of training data 532 generation will be described below in greater detail.

The machine learning-based scaling system 500 can include a capacitance scaling system 520 to receive an extracted model 504, for example, from a parasitic extraction engine using a default setting configuration, and receive the selected scaling coefficients 512 from the model classification system 510. In some embodiments, for example, in a block 603 of FIG. 6, a computing system implementing the parasitic extraction tool can generate parasitic models for the physical design layouts, such as generating the extracted model 504 from the physical layout model 502. The extracted model 504 can include parasitic electrical values from the physical layout model 502 that have been aggregated into a parasitic electrical model of the physical layout model 502. In some embodiments, the extracted model 504 can describe or model the electronic device in a Standard Parasitic Exchange Format (SPEF), or the like.

The capacitance scaling system 520 can generate a netlist 506 from the extracted model 504, for example, by scaling coupling capacitances in the extracted model 504 with the selected scaling coefficients 512. In some embodiments, for example, in a block 604 of FIG. 6, the computing system implementing the parasitic extraction tool can apply the selected scaling coefficients to the coupling capacitances in the parasitic models to generate a parasitic netlist, such as netlist 506. The netlist 506 can correspond to one or more electrical parasitic models for the physical design layout 502. In some embodiments, the netlist 506 can describe or model the electronic device in a Standard Parasitic Exchange Format (SPEF), or the like.

The machine learning-based scaling system 500 can include a configuration system 530 to receive test layout models 503 and corresponding reference netlists 508 or reference numbers in test cases. The test layout models 503 can describe test layout designs in terms of planar geometric shapes corresponding to patterns of metal, oxide, or semiconductor layers that make up components of the electronic device. In some embodiments, the layout design in the test layout models 503 can describe or model an electronic device in a Library Exchange Format (LEF), a Design Exchange Format (DEF), or the like. The reference netlists 508 can include netlists describing parasitic electrical models associated with their corresponding test layout model 503. In some embodiments, the reference netlists 508 can describe or model an electronic device in a Standard Parasitic Exchange Format (SPEF), or the like. The reference numbers can correspond to values, such as oscillation frequency, delay, or the like, of simulated netlists associated with the test cases.

The configuration system 530 can generate extracted test models 505 for test layout models 503 or fragments thereof. The extracted test models 505 can include netlists describing parasitic electrical models associated with their corresponding test layout model 503 or fragments thereof, for example, describing or modeling an electronic device in a Standard Parasitic Exchange Format (SPEF), or the like. The configuration system 530 can receive the extracted test models 505, for example, from the parasitic extraction engine in the parasitic extraction tool.

The configuration system 530 can include a clustering system 531 to cluster the extracted test models 505 together into groups. In some embodiments, the clustering system 531 can compare the extracted test models 505 to their corresponding reference netlist 508 and determine differences in capacitance values between them. The clustering system 531 also can simulate the extracted test models 505, compare simulation results to their corresponding reference number, and determine differences in the simulation results and the reference number. The clustering system 531 can select a setting configuration of the parasitic extraction tool for each test layout model 503 or fragment thereof based on the determined differences in the capacitance values or simulated results between the extracted test models 505 to their corresponding reference netlist 508 or reference number, respectively. The clustering system 531 can cluster the identified extracted test models 505 into groups based on the selected settings of the parasitic extraction tool used to generate the identified extracted test model 505.

In some embodiments, the clustering system 531 can implement a script, for example, from the manufacturer, which can prompt the clustering system 531 to compare the extracted test models 505 against reference netlists or to simulate the extracted test models 505 and compare simulation values to reference numbers. The clustering system 531 can cluster the extracted test models 505 into groups based, at least in part, on the results of the comparison prompted by the script.

The configuration system 530 can include a scaling coefficient system 900 to determine a set of scaling coefficients for each group of the extracted test models 505. In some embodiments, the scaling coefficient system 900 can analyze a first group of the extracted test models 505 and identify a first set of the scaling coefficients, analyze a second group of the extracted test models 505 and identify a second set of the scaling coefficients, and so on, until each group has been analyzed and a set of scaling coefficients has been found for each group. In some embodiments, the scaling coefficient system 900 can be implemented with a machine learning-based system to initially determine the scaling coefficients based on the geometries of the test layout models 503 or fragments thereof in a group before iteratively adjusting the scaling coefficients based on errors with their corresponding reference netlists 508. Embodiments of the scaling coefficient system 900 will be described below in greater detail with reference to FIGS. 9 and 10.

The configuration system 530 can include a coefficient assignment system 533 to assign a set of the scaling coefficients to each of the test layout models 503 or fragments thereof. Embodiments of scaling coefficient assignment will be described below with reference to FIGS. 7 and 8. The configuration system 530 can utilize combinations of the test layout models 503 or fragments thereof and the assigned set of scaling coefficients as the training data 532 for a machine-learning classifier in the model classification system 510. The training data 532 can include the test layout models 503 or fragments thereof labeled with their assigned sets of the scaling coefficients.

Figure 7:
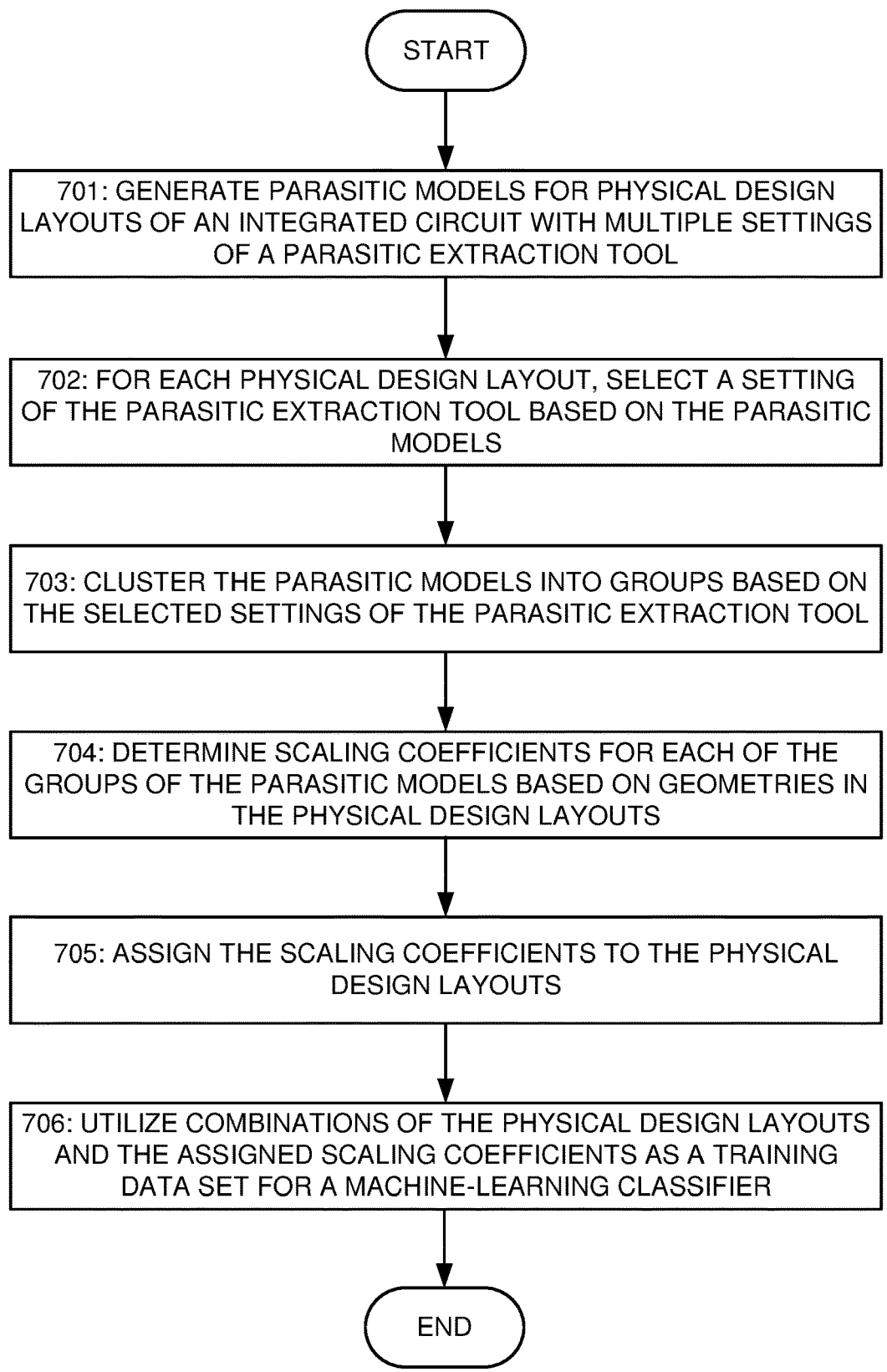
FIG. 7 illustrates a flowchart showing example generation of training data for a machine-learning classifier in a parasitic extraction tool according to various examples.

FIG. 7 illustrates a flowchart showing example generation of training data for a machine-learning classifier in a parasitic extraction tool according to various examples. Referring to FIG. 7, in a block 701, a computing system implementing the parasitic extraction tool can generate parasitic models for physical design layouts of an integrated circuit with multiple setting configurations of a parasitic extraction tool. The multiple setting configurations of the parasitic extraction tool can include a default setting configuration along with various adjustments to individual settings of the parasitic extraction tool, such as adjustments to an accuracy mode, adjustments to the physical properties of the layers in the physical design layouts, or the like. The parasitic models can include netlists describing parasitic electrical models associated with their corresponding physical design layouts or fragments thereof, for example, describing or modeling an electronic device in a Standard Parasitic Exchange Format (SPEF), or the like.

In a block 702, the computing system implementing the parasitic extraction tool can select a setting configuration of the parasitic extraction tool for each physical design layout based on the determined differences in the capacitance values between the parasitic models to corresponding reference netlists or based on determined differences between simulated values of the parasitic models and a corresponding reference numbers. For example, the parasitic extraction tool can identify a parasitic model having a smallest difference with the reference netlists for each physical design layout or fragment thereof and then select a setting configuration of the parasitic extraction tool used to generate the identified parasitic model. In another example, the parasitic extraction tool can identify simulation results from a parasitic model having a smallest difference with the reference number for each physical design layout or fragments thereof and then select a setting configuration of the parasitic extraction tool used to generate the parasitic model.

In a block 703, the computing system implementing the parasitic extraction tool can cluster the identified parasitic models into groups based on the selected settings of the parasitic extraction tool used to generate the identified parasitic models.

In a block 704, the computing system implementing the parasitic extraction tool can determine at least one set of scaling coefficients for each group of the parasitic models. In some embodiments, the parasitic extraction tool can analyze a first group of the parasitic models and their corresponding physical design layouts to identify a first set of the scaling coefficients, analyze a second group of the parasitic models and their corresponding physical design layouts to identify a second set of the scaling coefficients, and so on, until each group has been analyzed and at least one set of scaling coefficients has been found for each group. In some embodiments, the parasitic extraction tool can include a machine learning-based system to initially determine the scaling coefficients based on the geometries of the physical design layouts or fragments thereof in a group before iteratively adjusting the scaling coefficients based on errors with their corresponding reference netlists. Embodiments of the scaling coefficient generation will be described below in greater detail with reference to FIGS. 9 and 10.

In a block 705, the computing system implementing the parasitic extraction tool can assign a set of the scaling coefficients to each of the physical design layouts or fragments thereof. In some embodiments, the parasitic extraction tool can apply the sets of scaling coefficients to each of the parasitic models in the groups and assign those parasitic models a set of the scaling coefficients used to produce the smallest difference with the corresponding reference netlists or used to generate simulated results with a smallest difference to reference numbers. For example, a first parasitic model can have its coupling capacitances separately scaled by the different sets of the scaling coefficients and then compare those separately scaled extracted test models against a reference netlist corresponding to the first extracted test model. The parasitic extraction tool can assign the first parasitic model a set of the scaling coefficients used to produce the scaled extracted test model with smallest different to the reference netlist. In some embodiments, the parasitic extraction tool can assign the sets of scaling coefficients based the grouping of the parasitic models. For example, a parasitic model in a first group can be correlated to the set of scaling coefficients generated for the first group, and the physical design layout or fragments thereof associated with the parasitic models can be assigned the set of scaling coefficients generated for the first group.

In some embodiments, the parasitic extraction tool can determine the differences between the scaled parasitic models and a reference netlist or number exceed a threshold level and re-initiate the configuration process for that physical design layout or fragment thereof. This re-initiation of the configuration process can start by re-generating new parasitic models from the physical design layout or fragments thereof with new configuration settings of the parasitic extraction tool, for example, restarting at a block 701 for that specific physical design layout or fragment thereof.

In a block 706, the computing system implementing the parasitic extraction tool can utilize combinations of the physical design layouts or fragments thereof and the assigned set of scaling coefficients as the training data for a machine-learning classifier in the parasitic extraction tool. The training data can include the physical design layouts or fragments thereof labeled with their assigned sets of the scaling coefficients.

Figure 8:
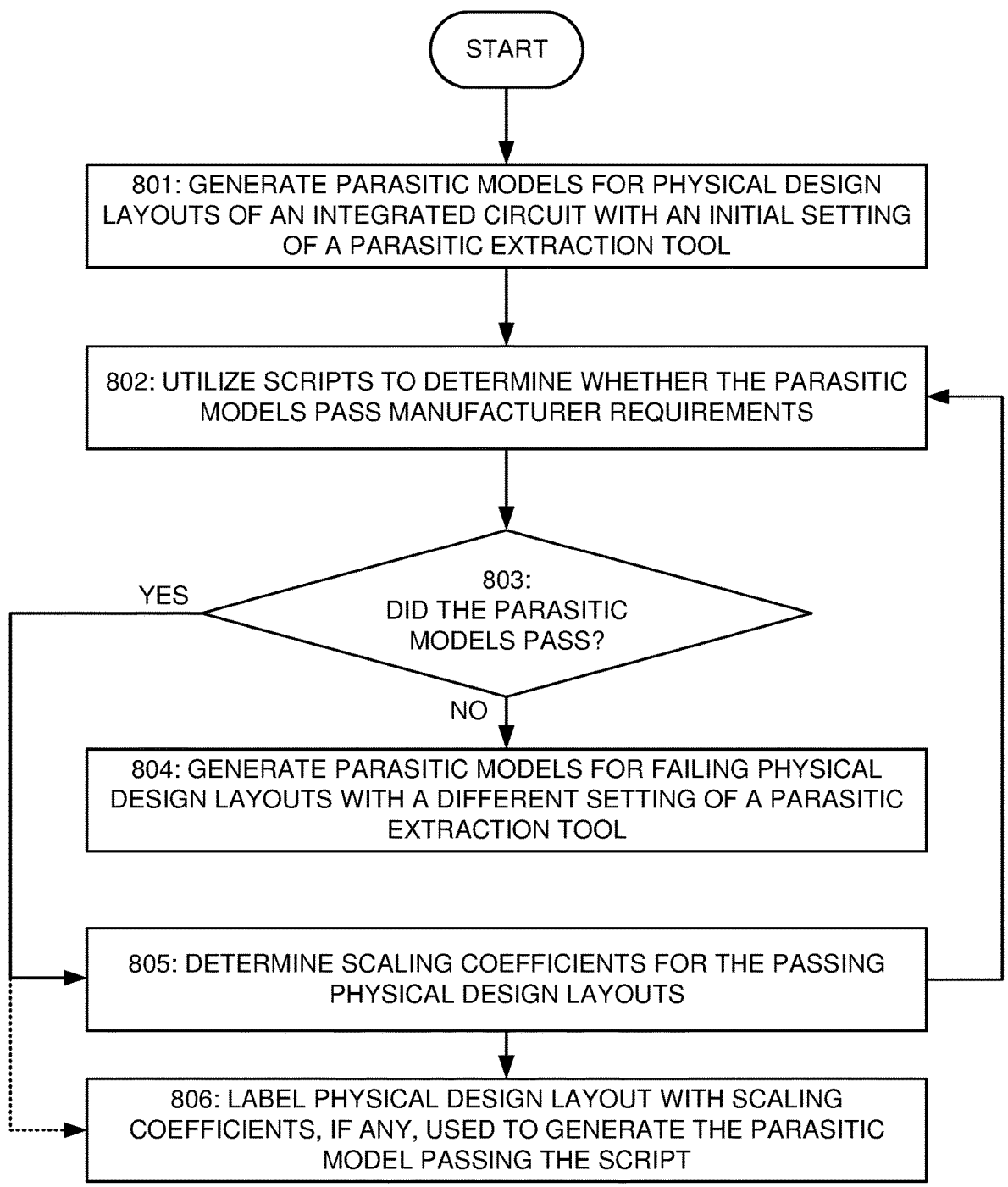
FIG. 8 illustrates a flowchart showing another example generation of training data for a machine-learning classifier in a parasitic extraction tool according to various examples.

FIG. 8 illustrates a flowchart showing another example generation of training data for a machine-learning classifier in a parasitic extraction tool according to various examples. Referring to FIG. 8, in a block 801, a computing system implementing a parasitic extraction tool can generate parasitic models for physical design layouts of an integrated circuit with an initial setting of the parasitic extraction tool. The initial setting of the parasitic extraction tool can include a setting configuration of an accuracy mode, physical properties of the layers in the physical design layouts, or the like. The parasitic models can include netlists describing parasitic electrical models associated with their corresponding physical design layouts or fragments thereof, for example, describing or modeling an electronic device in a Standard Parasitic Exchange Format (SPEF), or the like.

In a block 802, the computing system implementing the parasitic extraction tool can utilize scripts to determine whether the parasitic models pass manufacturer requirements. The scripts can prompt the parasitic extraction tool to compare the parasitic model against their corresponding reference netlists. In some embodiments, the scripts can prompt the parasitic extraction tool to simulate the parasitic model and compare values determined as a result of the simulation to reference values.

In a block 803, the computing system implementing the parasitic extraction tool can determine whether the parasitic models pass tests associated with the scripts. In some embodiments, the parasitic extraction tool can utilize differences between the parasitic model and the reference netlist or differences in the simulation value and the reference value to determine whether the parasitic extraction tool passed a manufacturer test for corresponding physical design layouts. For example, when the differences fall below a preset error threshold or fall within a prescribed range, the parasitic extraction tool can be deemed to have passed the manufacturer tests for those physical design layouts.

If, in the block 803, the parasitic extraction tool passes the manufacturer test with the initial setting, operation can proceed to a block 806, where the computing system implementing the parasitic extraction tool can label physical design layout with no scaling coefficients.

If, in the block 803, the parasitic extraction tool fails the manufacturer test, operation can proceed to a block 804, where the computing system implementing the parasitic extraction tool can generate parasitic models for failing physical design layouts with a different setting of a parasitic extraction tool. The different settings of the parasitic extraction tool can include a setting configurations generated by adjusting the accuracy mode, the physical properties of the layers in the physical design layouts, or the like. The parasitic models can include netlists describing parasitic electrical models associated with their corresponding physical design layouts or fragments thereof, for example, describing or modeling an electronic device in a Standard Parasitic Exchange Format (SPEF), or the like. Operation can proceed back to the block 802, where the parasitic extraction tool can implement the script for the parasitic models generated with the different setting and, in the block 803, the parasitic extraction tool can determine whether the parasitic extraction tool passed the manufacturer test with the different setting.

If, in the block 803, the parasitic extraction tool passes the manufacturer test with the one of the different settings, operation can proceed to a block 805, where the computing system implementing the parasitic extraction tool can determine scaling coefficients for the physical design layouts having passed the manufacturer test in the block 803. In some embodiments, the parasitic extraction tool can generate the scaling coefficients for the physical design layouts associated with the passing test, for example, by utilizing the geometries of the passing physical design layouts. Embodiments of the scaling coefficient generation will be described below with reference to FIGS. 9 and 10.

In the block 806, the computing system implementing the parasitic extraction tool can label physical design layout with scaling coefficients generated in the block 805. The parasitic extraction tool can aggregate the physical design layouts having been labeled in the block 806 to form training data for a machine learning-based classifier utilized in the parasitic extraction tool.

Machine Learning-Based Scaling Coefficient Determination

Figure 9:
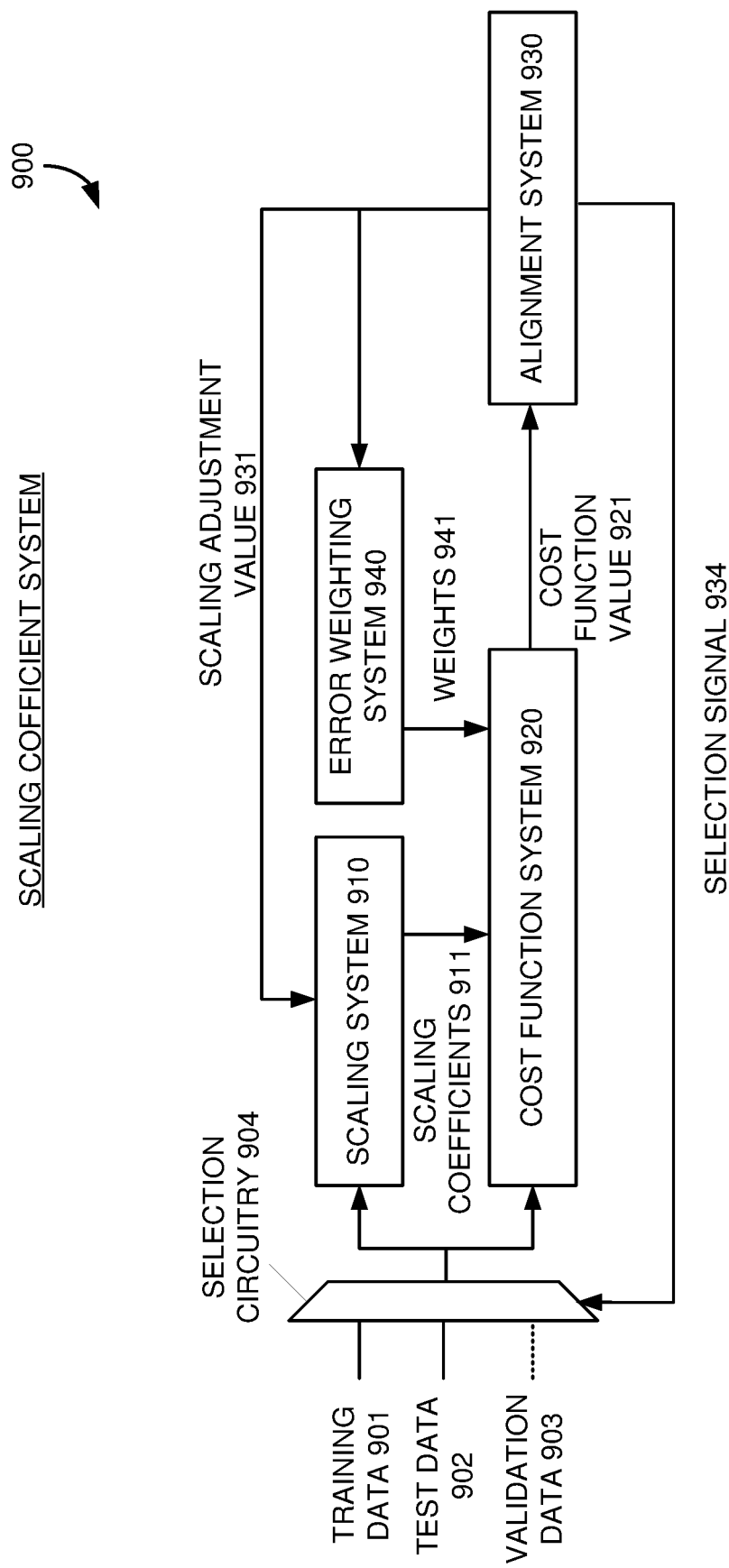
FIG. 9 illustrates an example machine learning-based scaling coefficient system implemented in a parasitic extraction tool according to various examples.
Figure 10:
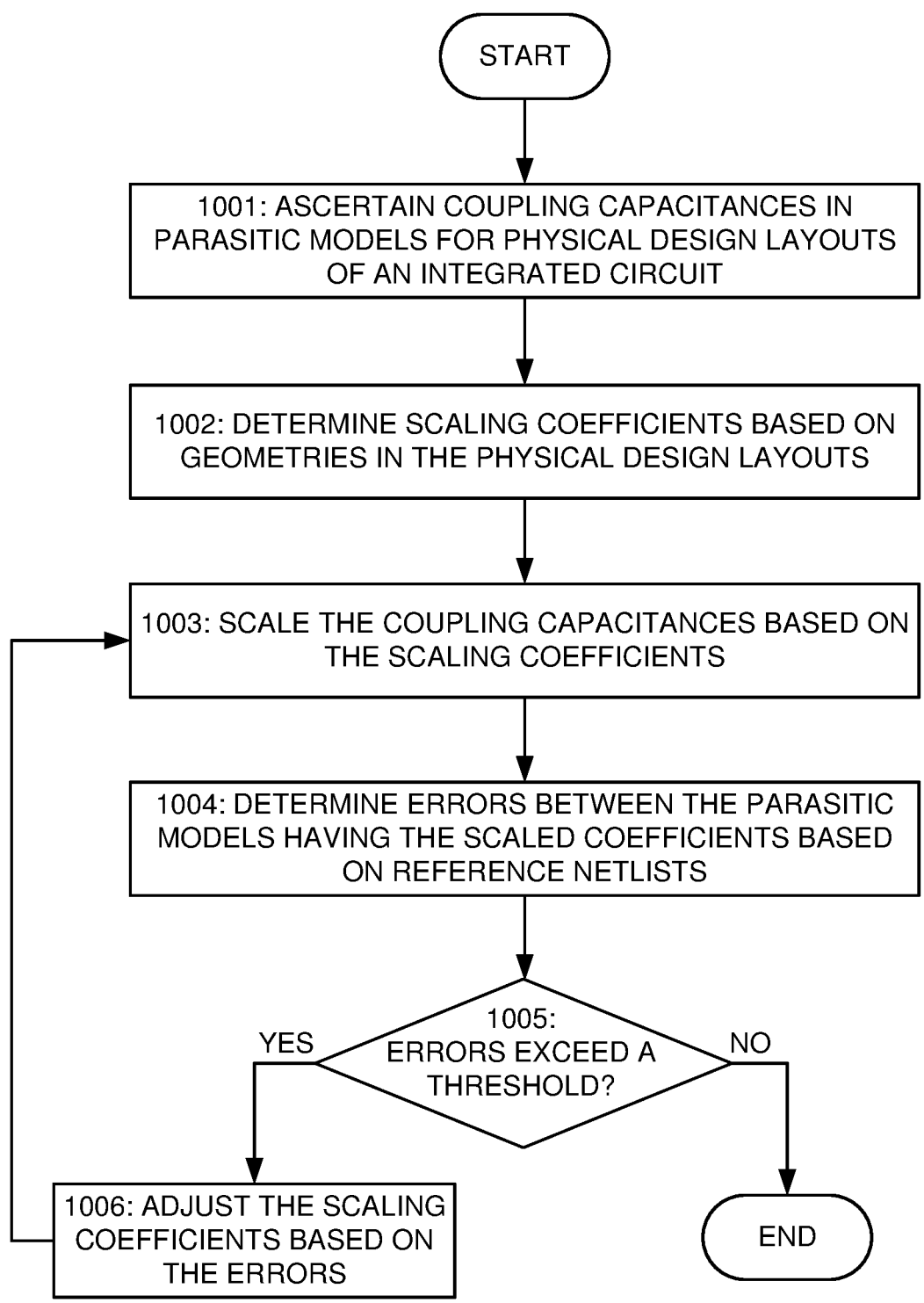
FIG. 10 illustrates a flowchart showing example scaling coefficient determination in a parasitic extraction tool according to various examples.

FIG. 9 illustrates an example machine learning-based scaling coefficient system implemented in a parasitic extraction tool according to various examples. FIG. 10 illustrates a flowchart showing example scaling coefficient determination in a parasitic extraction tool according to various examples. Referring to FIGS. 9 and 10, a scaling coefficient system 900 can include a scaling system 910 to receive one or more physical design layouts of an integrated circuit and parasitic models extracted from the physical design layouts, for example, by a parasitic extraction engine. The physical design layouts can describe the layers of the geometries, minimum distances between the geometries, information corresponding to the nets associated with the geometries, or the like. In some embodiments, the scaling system 910 can receive the physical design layouts and corresponding parasitic models via selection circuitry 904, which can output training data 901, test data 902, and/or validation data 903 based on a selection signal 934. The training data 901, the test data 902, and the validation data 903 each can include the physical design layouts and corresponding parasitic models.

In a block 1001, the scaling system 910 can ascertain coupling capacitances in the parasitic models for the physical design layouts of the integrated circuit and, in a block 1002, the scaling system 910 can determine scaling coefficients 911 based on geometries in the physical design layouts. In some embodiments, the scaling system 910 can generate a feature vector based on the geometries in the physical design layouts or a portion thereof and then generate the scaling coefficients 911 from the feature vector. For example, when the feature vector includes an average thickness between two geometries, the scaling system 910 can retrieve the thicknesses of the two geometries from the physical design layouts and derive the average of the thicknesses for inclusion in the feature vector. In some embodiments, the feature vector may include a distance between the geometries, which the scaling system 910 can ascertain from the physical design layouts. In a block 1003, the scaling system 910 can scale the coupling capacitances based on the scaling coefficients 911 and then utilize the scaled coupling capacitances with the physical design layouts to generate actual results for the parasitic models.

The scaling coefficient system 900 can include a cost function system 920 to receive the scaling coefficients 911 from the scaling system 910 and receive the physical design layouts and corresponding parasitic models from the selection circuitry 904. The cost function system 920 also can receive reference models via the selection circuitry 904. The reference models can describe electrical parasitic models of a test specification that described the physical design layouts, for example, generated by a foundry.

In a block 1004, the cost function system 920 can compare the actual results for the parasitic models against the reference models to determine errors between them for each of the coupling capacitances. The cost function system 920 can generate a cost function value 921 based on the errors between the actual results for the parasitic models against the reference models. In some embodiments, the cost function value 921 can be an absolute value of an accumulation of the errors between the actual results for the parasitic models against the reference models.

The scaling coefficient system 900 can include an alignment system 930 to receive the cost function value 921 from the cost function system 920. In a decision block 1005, the alignment system 930 can utilize the cost function value 921 to determine whether each of the errors between the actual results for the parasitic models against the reference models exceed a threshold level of allowable error. When the alignment system 930 determines that the errors for each of the coupling capacitances fall below the preset threshold value, the alignment system 930 can indicate that the scaling coefficients 911 utilized to scale the coupling capacitances allowed the parasitic extraction tool to generate parasitic models that satisfied a set of test cases.

When the alignment system 930 determines that any of errors for the coupling capacitances exceed the preset threshold value, the alignment system 930, in a block 1006, can determine an adjustment for the scaling coefficients 911 based on the errors and generate a scaling adjustment value 931. The alignment system 930 can provide the scaling adjustment value 931 to the scaling system 910 for subsequent generation of the scaling coefficients 911.

The scaling coefficient system 900 can include an error weighting system 940 to set weights 941 for each of the errors associated with coupling capacitances in the determination of the cost function value 921. The alignment system 930 can provide the scaling adjustment value 931 to the error weighting system 940 for use in generating the weights 941. Since the cost function value 921 corresponds to an accumulation of the coupling capacitance errors, by setting weights 941 for each of the coupling capacitance errors, the error weighting system 940 can identify which coupling capacitance errors can be adjusted. For example, when the error weighting system 940 determines a first coupling capacitance has an error that should be reduced, the error weighting system 940 can provide it a high weight 941. The higher the weight 941 given to a coupling capacitance error, the more that coupling capacitance error will contribute to the cost function value 921 and the greater the impact an adjustment to the error via scaling would impact the cost function value 921. Conversely, when the error weighting system 940 determines a second coupling capacitance has an error that should not be significantly adjusted, the error weighting system 940 can provide it a low weight 941. The lower the weight 941 given to a coupling capacitance error, the less that coupling capacitance error will contribute to the cost function value 921 and the lower the impact an adjustment to the error via scaling would impact the cost function value 921.

The alignment system 930 also can generate the selection signal 934, which can control the selection circuitry 904 to output the training data 901, the test data 902, or the validation data 903. In some embodiments, the alignment system 930 can initially generate a selection signal 934 that directs the selection circuitry 904 to output the training data 901. After the alignment system 930 has determined the errors associated with the training data 901 have fallen below the threshold level, for example, set scaling coefficients 911 for the cost function system 920, the alignment system 930 can generate a selection signal 934 that directs the selection circuitry 904 to output the test data 902. After the alignment system 930 has determined the errors associated with the test data 902 have fallen below the threshold level, the alignment system 930 can generate a selection signal 934 that directs the selection circuitry 904 to output the validation data 903, which can be utilized by the scaling coefficient system 900 to ensure the values of the scaling coefficients determined via the training data 901 and test data 902 would configure the parasitic extraction tool for use on other physical design layouts.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

CONCLUSION

While the application describes specific examples of carrying out embodiments of the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A method comprising:
classifying, by a computing system implementing a parasitic extraction tool, a physical design layout of an integrated circuit by generating a feature vector that describes physical characteristics associated with the physical design layout and utilizing the feature vector to classify the physical design layout according to a structural density of the physical design layout;
selecting, by the computing system implementing the parasitic extraction tool, a set of scaling coefficients based on the classification of the physical design layout, which associate the structural density of the physical design layout to the selected set of the scaling coefficients;

generating, by the computing system implementing the parasitic extraction tool, a parasitic model for the physical design layout, wherein the parasitic model includes an electrical representation of nets extracted from the physical design layout; and adjusting, by the computing system implementing the parasitic extraction tool, coupling capacitances in the parasitic model using the selected set of the scaling coefficients.

2. The method of claim 1, wherein the classifying of the physical design layout is performed by a machine-learning classifier trained with a training data set including test physical design layouts labeled with sets of scaling coefficients.

3. The method of claim 2, further comprising generating, by the computing system, the training data set by determining the sets of the scaling coefficients from the test physical design layouts and labeling the test physical design layouts with the sets of the scaling coefficients.

4. The method of claim 3, wherein determining the sets of the scaling coefficients from the test physical design layouts further comprises:

generating parasitic models for the test physical design layouts using different setting configurations for a parasitic extraction tool;

selecting, for each of the test physical design layouts, a setting configuration of the parasitic extraction tool based, at least in part, on the parasitic models;

clustering the parasitic models into groups based on the selected settings of the parasitic extraction tool; and determining a set of the scaling coefficients for each of the groups of the parasitic models based on geometric information in the test physical design layouts.

5. The method of claim 4, wherein the selecting, for each of the test physical design layouts, of the setting configuration of the parasitic extraction tool further comprises:

comparing, for each of the test physical design layouts, the parasitic models generated using different setting configurations against reference models associated with the test physical design layouts; and selecting, for each of the test physical design layouts, the setting configuration of the parasitic extraction tool having smallest differences to the reference models determined with the comparison.

6. The method of claim 4, wherein the determination of the set of the scaling coefficients for each of the groups of the parasitic models is performed by iteratively adjusting, for each of the groups of the parasitic models, the scaling coefficients in the set based on differences between reference models associated with the group and the parasitic models having the adjusted the scaling coefficients.

7. The method of claim 3, wherein labeling the test physical design layouts with the sets of the scaling coefficients further comprises:

applying the sets of the scaling coefficients to parasitic models generated from the test physical design layouts, which adjusts coupling capacitances in the parasitic models; and assigning each of the test physical design layouts one of the sets of the scaling coefficients based, at least in part, on a comparison of the parasitic models having adjusted coupling capacitances against reference models associated with the test physical design layouts.

8. A system comprising:

a memory device configured to store machine-readable instructions; and a computing system including one or more processing devices, in response to executing the machine-readable instructions, configured to:

classify a physical design layout of an integrated circuit by generating a feature vector that describes physical characteristics associated with the physical design layout and utilizing the feature vector to classify the physical design layout according to a structural density of the physical design layout;

select a set of scaling coefficients based on the classification of the physical design layout, which associate the structural density of the physical design layout to the selected set of the scaling coefficients;

generate a parasitic model for the physical design layout, wherein the parasitic model includes an electrical representation of nets extracted from the physical design layout; and adjust coupling capacitances in the parasitic model using the selected set of the scaling coefficients.

9. The system of claim 8, wherein the one or more processing devices, in response to executing the machine-readable instructions, are configured to classify the physical design layout using a machine-learning classifier trained with a training data set including test physical design layouts labeled with sets of scaling coefficients.

10. The system of claim 9, wherein the one or more processing devices, in response to executing the machine-readable instructions, are configured to generate the training data set by determining the sets of the scaling coefficients from the test physical design layouts and labeling the test physical design layouts with the sets of the scaling coefficients.

11. The system of claim 10, wherein the determining of the sets of the scaling coefficients from the test physical design layouts further comprises:

generating parasitic models for the test physical design layouts using different setting configurations for a parasitic extraction tool;

selecting, for each of the test physical design layouts, a setting configuration of the parasitic extraction tool based, at least in part, on the parasitic models;

clustering the parasitic models into groups based on the selected settings of the parasitic extraction tool; and determining a set of the scaling coefficients for each of the groups of the parasitic models based on geometric information in the test physical design layouts.

12. The system of claim 11, wherein the selecting, for each of the test physical design layouts, of the setting configuration of the parasitic extraction tool further comprises:

comparing, for each of the test physical design layouts, the parasitic models generated using different setting configurations against reference models associated with the test physical design layouts; and selecting, for each of the test physical design layouts, the setting configuration of the parasitic extraction tool having smallest differences to the reference models determined with the comparison.

13. The system of claim 11, wherein the determination of the set of the scaling coefficients for each of the groups of the parasitic models is performed by iteratively adjusting, for each of the groups of the parasitic models, the scaling coefficients in the set based on differences between reference models associated with the group and the parasitic models having the adjusted the scaling coefficients.

14. An apparatus including a memory device storing instructions configured to cause one or more processing devices to perform operations comprising:

classifying a physical design layout of an integrated circuit by generating a feature vector that describes physical characteristics associated with the physical design layout and utilizing the feature vector to classify the physical design layout according to a structural density of the physical design layout;

selecting a set of scaling coefficients based on the classification of the physical design layout, which associate the structural density of the physical design layout to the selected set of the scaling coefficients;

generating a parasitic model for the physical design layout, wherein the parasitic model includes an electrical representation of nets extracted from the physical design layout; and adjusting coupling capacitances in the parasitic model using the selected set of the scaling coefficients.

15. The apparatus of claim 14, wherein the classifying of the physical design layout is performed by a machine-learning classifier trained with a training data set including test physical design layouts labeled with sets of scaling coefficients.

16. The apparatus of claim 15, wherein the instructions are configured to cause one or more processing devices to perform operations further comprising generating the training data set by determining the sets of the scaling coefficients from the test physical design layouts and labeling the test physical design layouts with the sets of the scaling coefficients.

17. The apparatus of claim 16, wherein determining the sets of the scaling coefficients from the test physical design layouts further comprises:

generating parasitic models for the test physical design layouts using different setting configurations for a parasitic extraction tool;

selecting, for each of the test physical design layouts, a setting configuration of the parasitic extraction tool based, at least in part, on the parasitic models;

clustering the parasitic models into groups based on the selected settings of the parasitic extraction tool; and determining a set of the scaling coefficients for each of the groups of the parasitic models based on geometric information in the test physical design layouts.

18. The apparatus of claim 17, wherein the selecting, for each of the test physical design layouts, of the setting configuration of the parasitic extraction tool further comprises:

comparing, for each of the test physical design layouts, the parasitic models generated using different setting configurations against reference models associated with the test physical design layouts; and selecting, for each of the test physical design layouts, the setting configuration of the parasitic extraction tool having smallest differences to the reference models determined with the comparison.

19. The apparatus of claim 17, wherein the determination of the set of the scaling coefficients for each of the groups of the parasitic models is performed by iteratively adjusting, for each of the groups of the parasitic models, the scaling coefficients in the set based on differences between reference models associated with the group and the parasitic models having the adjusted the scaling coefficients.

20. The apparatus of claim 16, wherein labeling the test physical design layouts with the sets of the scaling coefficients further comprises:

applying the sets of the scaling coefficients to parasitic models generated from the test physical design layouts, which adjusts coupling capacitances in the parasitic models; and assigning each of the test physical design layouts one of the sets of the scaling coefficients based, at least in part, on a comparison of the parasitic models having adjusted coupling capacitances against reference models associated with the test physical design layouts.

* * * * *